(12) United States Patent
Zhang

(10) Patent No.: US 12,117,735 B2
(45) Date of Patent: Oct. 15, 2024

(54) METHOD OF DETERMINING OVERLAY ERROR DURING SEMICONDUCTOR FABRICATION

(71) Applicant: NANYA TECHNOLOGY CORPORATION, New Taipei (TW)

(72) Inventor: Kai Zhang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 417 days.

(21) Appl. No.: 17/673,155

(22) Filed: Feb. 16, 2022

(65) Prior Publication Data

US 2023/0259039 A1    Aug. 17, 2023

(51) Int. Cl.
*H01L 21/00* (2006.01)
*G03F 7/00* (2006.01)
*H01L 23/544* (2006.01)

(52) U.S. Cl.
CPC ........ *G03F 7/70633* (2013.01); *G03F 7/7065* (2013.01); *H01L 23/544* (2013.01); *H01L 2223/54426* (2013.01); *H01L 2223/5446* (2013.01)

(58) Field of Classification Search
CPC ... G03F 7/70633; G03F 7/7065; H01L 23/544
See application file for complete search history.

(56) References Cited

U.S. PATENT DOCUMENTS

| | | | | |
|---|---|---|---|---|
| 7,136,520 | B2 * | 11/2006 | Lan | H01L 22/34 382/151 |
| 7,217,581 | B2 * | 5/2007 | Huang | H01L 22/34 438/16 |
| 9,702,693 | B2 * | 7/2017 | Ghinovker | G03F 7/70633 |
| 9,857,678 | B1 * | 1/2018 | Park | G03F 7/203 |
| 11,469,140 | B2 * | 10/2022 | Wu | H01L 21/76831 |
| 11,605,559 | B2 * | 3/2023 | Wu | H01L 21/76805 |

(Continued)

FOREIGN PATENT DOCUMENTS

| | | | | |
|---|---|---|---|---|
| CN | 1109215 A | | 9/1995 | |
| CN | 102402129 A | * | 4/2012 | G02B 27/40 |

(Continued)

OTHER PUBLICATIONS

Nuriel Amir, "Multi Layer Overlay Measurement Recent Developments," Proceedings of SPIE, Apr. 10, 2013, vol. 8681 86812V-1, 9 pages.

(Continued)

*Primary Examiner* — Laura M Menz
(74) *Attorney, Agent, or Firm* — Muncy, Geissler, Olds & Lowe, P.C.

(57) ABSTRACT

The present application provides a method of determining an overlay error during a semiconductor fabrication. The method includes steps of forming a first structural layer comprising a target feature over a wafer; forming a second structural layer comprising a first axis, a second axis and a pair of alignment features over the first structural layer, wherein the pair of alignment features are disposed at the first and the second axes, respectively; and determining a relative displacement of the first and second structural layers using a position of the first axis relative to the target feature and a position of the second axis relative to the target feature.

16 Claims, 20 Drawing Sheets

(56) References Cited

U.S. PATENT DOCUMENTS

| | | | | |
|---|---|---|---|---|
| 11,796,924 B2* | 10/2023 | Ma | ............... | G03F 7/70633 |
| 11,829,078 B2* | 11/2023 | Liu | ............... | G03F 7/70633 |
| 2002/0076623 A1* | 6/2002 | Mori | ............... | G03F 1/84 |
| | | | | 430/30 |
| 2003/0044057 A1* | 3/2003 | Lan | ............... | H01L 22/34 |
| | | | | 382/145 |
| 2003/0223066 A1* | 12/2003 | Lee | ............... | G03F 7/70633 |
| | | | | 356/401 |
| 2004/0092080 A1* | 5/2004 | Chen | ............... | H01L 23/544 |
| | | | | 257/E23.179 |
| 2005/0100827 A1* | 5/2005 | Liao | ............... | G03F 7/70466 |
| | | | | 430/312 |
| 2005/0254030 A1* | 11/2005 | Tolsma | ............... | G03B 27/42 |
| | | | | 356/399 |
| 2006/0128041 A1* | 6/2006 | Huang | ............... | G03F 7/70633 |
| | | | | 438/18 |
| 2010/0073671 A1* | 3/2010 | Chou | ............... | G03F 7/7065 |
| | | | | 356/237.4 |
| 2011/0012271 A1* | 1/2011 | Chiu | ............... | G03F 9/7076 |
| | | | | 257/E23.179 |
| 2013/0157389 A1* | 6/2013 | Wang | ............... | G03F 7/70633 |
| | | | | 257/E21.53 |
| 2015/0028500 A1 | 1/2015 | Ning et al. | | |
| 2017/0062349 A1 | 3/2017 | Wang et al. | | |
| 2017/0221834 A1 | 8/2017 | Wang et al. | | |
| 2019/0164899 A1* | 5/2019 | Hu | ............... | H01L 23/544 |
| 2020/0103763 A1* | 4/2020 | Wen | ............... | G03F 7/70683 |
| 2020/0105629 A1* | 4/2020 | Chen | ............... | G03F 7/70633 |
| 2020/0118893 A1* | 4/2020 | Fang | ............... | H01L 22/30 |
| 2022/0068711 A1* | 3/2022 | Wu | ............... | H01L 21/76895 |
| 2022/0076998 A1* | 3/2022 | Wu | ............... | H01L 21/76895 |
| 2023/0194996 A1* | 6/2023 | Tsuchiya | ............... | G03F 7/70141 |
| | | | | 430/5 |
| 2023/0213873 A1* | 7/2023 | Ma | ............... | G03F 7/706837 |
| | | | | 430/22 |
| 2023/0215809 A1* | 7/2023 | Ma | ............... | G03F 1/42 |
| | | | | 257/797 |
| 2023/0259039 A1* | 8/2023 | Zhang | ............... | G03F 7/70633 |
| | | | | 438/14 |
| 2023/0260924 A1* | 8/2023 | Zhang | ............... | H01L 23/544 |
| | | | | 257/797 |
| 2023/0273530 A1* | 8/2023 | Liu | ............... | G03F 7/706851 |
| | | | | 356/399 |
| 2023/0273590 A1* | 8/2023 | Liu | ............... | G05B 19/4155 |
| | | | | 700/121 |
| 2024/0004300 A1* | 1/2024 | Tsai | ............... | H10B 12/482 |
| 2024/0008266 A1* | 1/2024 | Tsai | ............... | G03F 7/26 |

FOREIGN PATENT DOCUMENTS

| | | | | | |
|---|---|---|---|---|---|
| CN | 104078446 | A | * | 10/2014 | |
| CN | 104795383 | A | * | 7/2015 | |
| CN | 116613141 | A | * | 8/2023 | ......... G03F 7/70633 |
| CN | 116613142 | A | * | 8/2023 | ......... G03F 7/70633 |
| JP | 09166866 | A | * | 6/1997 | ......... G03F 7/70633 |
| JP | 2001201844 | A | * | 7/2001 | |
| TW | 200712429 | A | | 4/2007 | |
| TW | 200715439 | A | | 4/2007 | |
| TW | 200732618 | A | | 9/2007 | |
| TW | 201102769 | A | | 1/2011 | |
| TW | 202335044 | A | * | 9/2023 | ......... G03F 7/70633 |
| TW | 202335232 | A | * | 9/2023 | ......... G03F 7/70633 |

OTHER PUBLICATIONS

Guido Rademaker, "Overlay and stitching metrology for massively parallel electron-beam lithography," Proceedings of SPIE, Mar. 22, 2018, vol. 10585 105850U-1, 14 pages.

Office Action mailed Mar. 25, 2023 in corresponding application TW 111115027, 3 pages.

* cited by examiner

METHOD OF DETERMINING OVERLAY ERROR DURING SEMICONDUCTOR FABRICATION

TECHNICAL FIELD

The present disclosure relates to an overlay mark for checking alignment accuracy, and more particularly, to an overlay metrology mark for aligning different layers of a substrate and to a method of determining an overlay error during a semiconductor fabrication.

DISCUSSION OF THE BACKGROUND

The semiconductor integrated circuit industry has experienced rapid growth. Technology advances in integrated circuit material and design have produced generations of integrated circuits where each generation has smaller and more complex circuits than the previous generation. Nowadays, the semiconductor devices and integrated circuits include multi-layer structures having dimensions smaller than one micrometer.

As known in the art, a photolithography process is a step that determines critical dimensions during fabrication of the semiconductor integrated circuit device. An electrical circuit pattern is formed by first transferring a pattern on a reticle to a photoresist layer using the photolithography process, and then transferring the pattern from the photoresist layer to an underlying material layer such as a dielectric layer or a metal layer in a subsequent etching process.

A successful photolithography process on a wafer depends on control of the critical dimensions as well as alignment accuracy. As reductions in integrated circuit scale continue, especially below 20 nanometers, aligning multiple layers accurately has become more and more difficult. Therefore, a measurement of accuracy, i.e., measurement of overlay error, is crucial to the semiconductor fabrication process. An overlay mask is used as a tool for measuring overlay error and to determine whether a photoresist pattern is precisely aligned with a previous layer on a wafer after the photolithography process.

If all or part of the overlay mask is not aligned properly, resulting features may not align correctly with adjoining layers. This may result in reduced device performance or complete device failure. While existing overlay (metrology) marks have been used to prevent the improper alignment, such approaches have not been entirely satisfactory for small-dimension devices.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides an overlay metrology mark for determining an overlay error between two successive layers of a substrate. The overlay metrology mark includes a first axis, a second axis, a target feature, a first alignment feature and a second alignment feature. The second axis crosses the first axis. The target feature is disposed at an intersection of the first axis and the second axis. The first alignment feature is arranged on the first axis, the second alignment feature is arranged on the second axis, and the first alignment feature and the second alignment feature are in pairs.

In some embodiments, the first axis, the second axis, the target feature, the first alignment feature and the second alignment feature are disposed in at least one scribe line of the substrate.

In some embodiments, a shortest distance between the first axis and one of the alignment features is equal to a shortest distance between the second axis and the other alignment feature.

In some embodiments, the target feature is disposed on a first layer of the substrate, and the first axis, the second axis, the first alignment feature and the second alignment feature are disposed on a second layer above or below the first layer.

In some embodiments, the target feature comprises two line segments, and the first and second axes overlap the line segments respectively when the first layer and the second layer are properly aligned.

In some embodiments, the first axis is orthogonal to the second axis.

In some embodiments, the target feature has a cross shape.

In some embodiments, the first alignment feature and the second alignment feature are respectively composed of repetitious micro-structures.

In some embodiments, the first alignment feature and the second alignment feature respectively have a square profile and are composed of a plurality of square micro-structures.

In some embodiments, the micro-structures are separated from each other via a pair of void zones.

In some embodiments, the void zones have a first width, and the micro-structures have a second width greater than the first width.

In some embodiments, the pair of the void zones include a horizontal void zone and a longitudinal void zone, the first axis extends through the horizontal void zone of the first alignment feature located at the first axis, and the second axis extends through the longitudinal void zone of the second alignment feature located at the second axis.

One aspect of the present disclosure provides an overlay metrology mark for determining relative positions of two or more successive patterned layers of a substrate. The overlay metrology mark includes a first axis, a second axis, a target feature and a plurality of alignment features. The second axis orthogonal to and across the first axis. The target feature is disposed at an intersection of the first axis and the second axis. The plurality of alignment features are arranged along the first and second axes.

In some embodiments, a distance between adjacent pairs of alignment features is a constant.

In some embodiments, the adjacent pairs of the alignment features that are separated from the intersection of the first and second axes by an equal distance are configured to determine the relative positions of the two or more successive patterned layers.

In some embodiments, the first axis separates the second axis into an upper segment and a lower segment; the second axis separates the first axis into a left segment and a right segment; the plurality of alignment features disposed at the upper and left segments are applied to determine the relative positions of the two or more successive patterned layers in an array zone of the substrate; and the plurality of alignment features disposed at the lower and right segments are applied to determine the relative positions of the two or more successive patterned layers in a periphery zone adjacent to the array zone.

In some embodiments, one of the plurality of alignment features disposed close to the target feature are fabricated prior to fabrication of another one of the plurality of alignment features disposed far away from the target feature.

In some embodiments, the first axis, the second axis, the target feature and the plurality of alignment features are disposed in scribe lines of the substrate.

In some embodiments, each of the first and second axes has a length of about 15 nanometers.

In some embodiments, the target feature is disposed on a first structural layer of the substrate, and the first axis, the second axis and the plurality of alignment features are disposed on a second structural layer above or below the first structural layer.

In some embodiments, the plurality of alignment features are divided into quarters via a pair of void zones, wherein the first axis or the second axis extends through the void zone.

In some embodiments, the overlay metrology mark has a reflectional symmetry and rotational symmetry.

One aspect of the present disclosure provides a method of determining an overlay error during a semiconductor fabrication. The method includes steps of forming a first structural layer comprising a target feature over a wafer; forming a second structural layer comprising a first axis, a second axis and a pair of alignment features over the first structural layer, wherein the pair of alignment features are disposed at the first and the second axes, respectively; and determining a relative displacement of the first and second structural layers using a position of the first axis relative to the target feature and a position of the second axis relative to the target feature.

In some embodiments, the method further includes a step of recording at least one image of a substrate comprising the wafer, the first structural layer and the second structural layer, wherein the relative displacement of the first and second structural layers is determined based on the at least one image.

In some embodiments, the first axis is formed to bisect one of the pair of alignment features; the second axis, crossing the first axis, is formed to bisect the another one of the pair of alignment features; the first structural layer and the second structural layer are properly aligned when an intersection of the first axis and the second axis overlaps the target feature.

In some embodiments, the first axis is formed to bisect the one of the pair of alignment features; the second axis, crossing the first axis, is formed to bisect the another one of the pair of alignment features; and the first structural layer and the second structural layer are not properly aligned when the intersection of the first axis and the second axis is offset from the target feature.

In some embodiments, the first structural layer and the second structural layer are not properly aligned when one of the first axis and the second axis is offset from the target feature.

In some embodiments, the second structural layer is formed using a lithography process.

In some embodiments, the second structural layer comprises photoresist material.

In some embodiments, the first axis, the second axis, the pair of alignment features and the target feature are located in at least one scribe line on the wafer.

With the above-mentioned configurations of the overlay metrology mark including the first and second axes crossing each other and extending through centers of the alignment feature, the overlay measurement for correcting the process in order to keep the overlay errors within desired limits can be effectively and rapidly accomplished.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
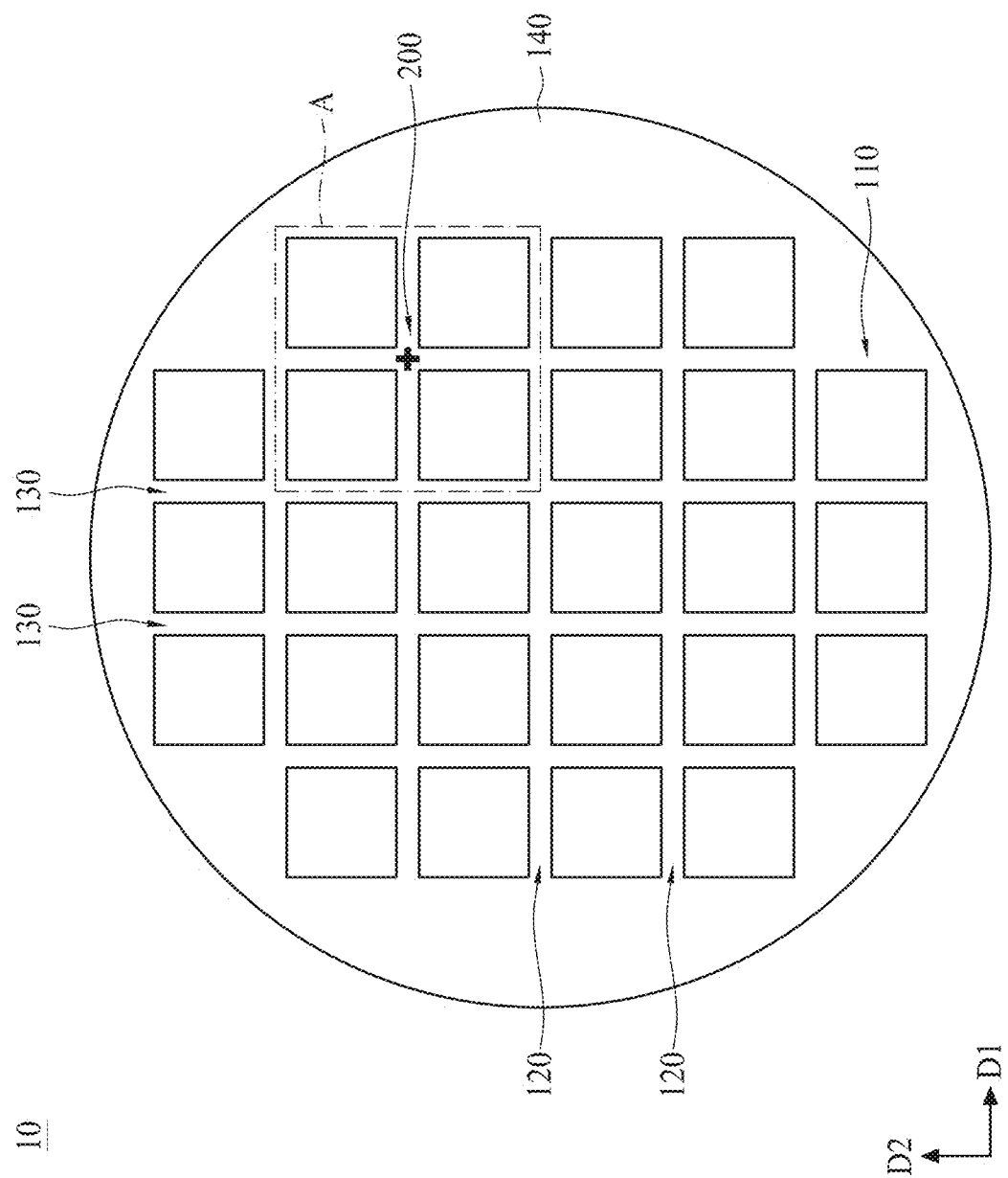
FIG. 1 is a top view of a substrate in accordance with some embodiments of the present disclosure.

Embodiments, or examples, of the disclosure illustrated in the drawings are described below using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition 1o of one or more other features, integers, steps, operations, elements, components, or groups thereof.

FIG. 1 is a top view of a substrate 10 in accordance with some embodiments of the present disclosure. Referring to FIG. 1, the substrate 10 includes a plurality of die regions 110 separated from each other by first scribe lines 120 and second scribe lines 130. The first scribe lines 120 extend along a first direction D1 and the second scribe lines 130 extend along a second direction D2. In some embodiments, the first direction D1 extends in a horizontal direction, and the second direction D2 extends in a vertical direction that is substantially perpendicular to the first direction D1.

In addition, each of the first scribe lines 120 crosses the second scribe lines 130 at right angles. Accordingly, the die regions 110, partitioned by the first and second scribe lines 120 and 130, generally have rectilinear shapes and are arranged in a matrix configuration on the substrate 10.

The substrate 10 may undergo a variety of processes including thin film forming, lithography, ion implantation and cleaning to form integrated circuits in the die regions 110, wherein the integrated circuit is a functional unit which eventually becomes a single die or chip. More particularly, various features and multiple structural layers to form the integrated circuits are fabricated in and on a single wafer 140 using processes including, but not limited to, oxidation, deposition, doping, diffusion, resist application and peeling, exposure, development, etching, metallization, annealing and chemical-mechanical polishing. The integrated circuit may include doped regions, isolation features and various layers that are not separately depicted and that combine to form various microelectronic elements including a logic device (such as a microcontroller) or a memory device (such as a dynamic random-access memory or a non-volatile memory).

The wafer 140 of the substrate 10 can be made of silicon. Alternatively or additionally, the wafer 140 may include other semiconductor material, such as III-V semiconductor materials. Example of layers on the wafer 140 include dielectric layers, doped layers and conductive layers including metal materials. In some embodiments, the first and second scribe lines 120 and 130 can have a width of about 30 to 100 micrometers depending on dimensions of the integrated circuits manufactured in and on the wafer 140.

After the fabrication, the substrate 10 is separated into individual integrated circuits by a technique such as dicing or sawing. Typically, the substrate 10 is sawed along the first and second scribe lines 120 and 130 to separate the die regions 110. The individual integrated circuits may be packaged separately, for example. Alternatively, the individual integrated circuits may be packaged in multi-chip modules. Notably, when a dicing operation is performed, an area of the wafer along the first and second scribe lines 120 and 130 is wasted.

Figure 2:
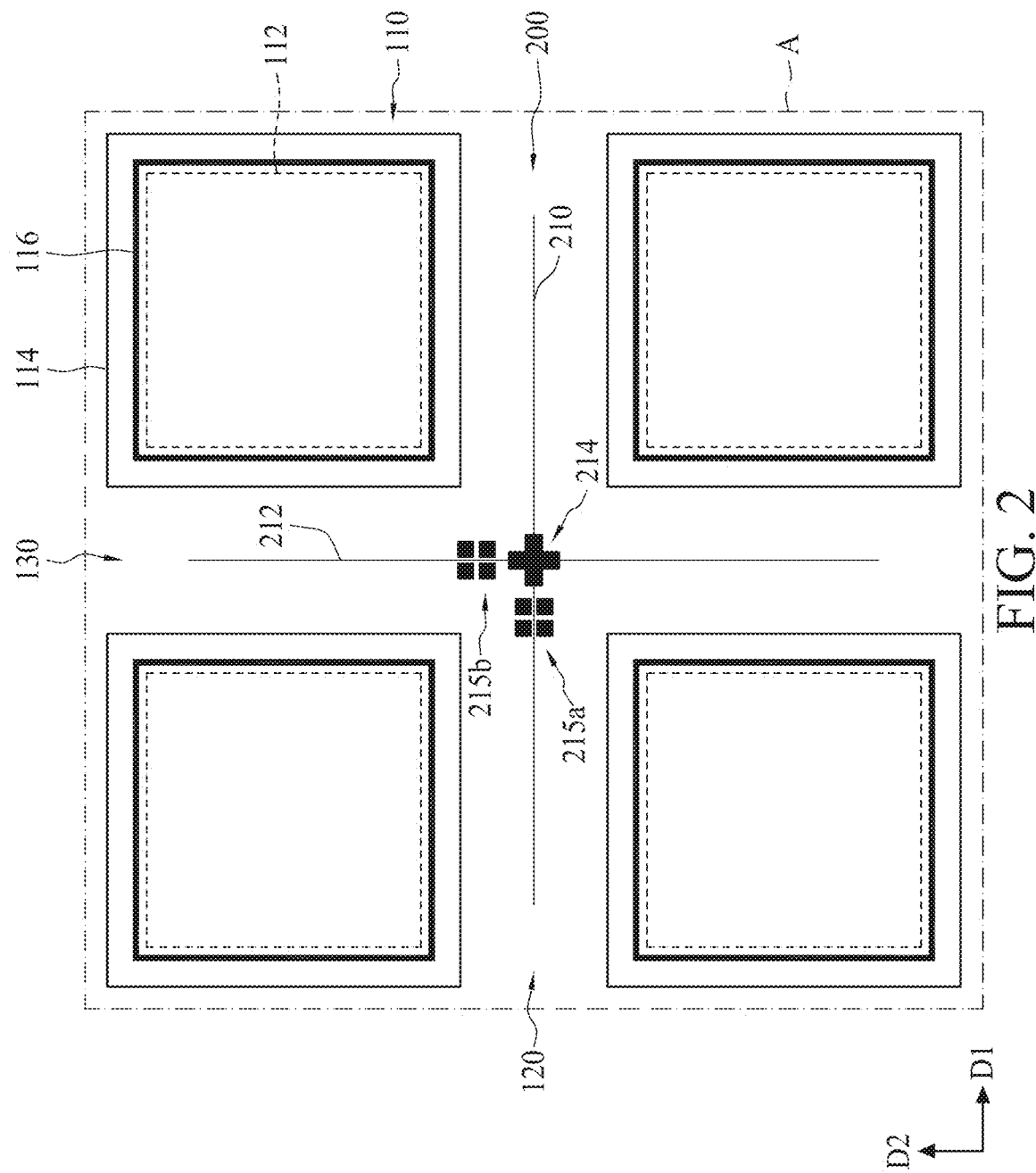
FIG. 2 is an enlarged view of an area A of FIG. 1.

FIG. 2 is an enlarged view of an area A of FIG. 1. Referring to FIG. 2, the die region 110 may comprise an array zone 112 and a peripheral zone 114 adjacent to the array zone 112. For example, when the integrated circuit is a dynamic random-access memory, a memory cell array 1122 (as shown in FIG. 3), including a plurality of memory cells 1124 for storing data, are provided in the array zone 112, and peripheral circuits, necessary for external input and output, are located in the peripheral zone 114.

Figure 3:
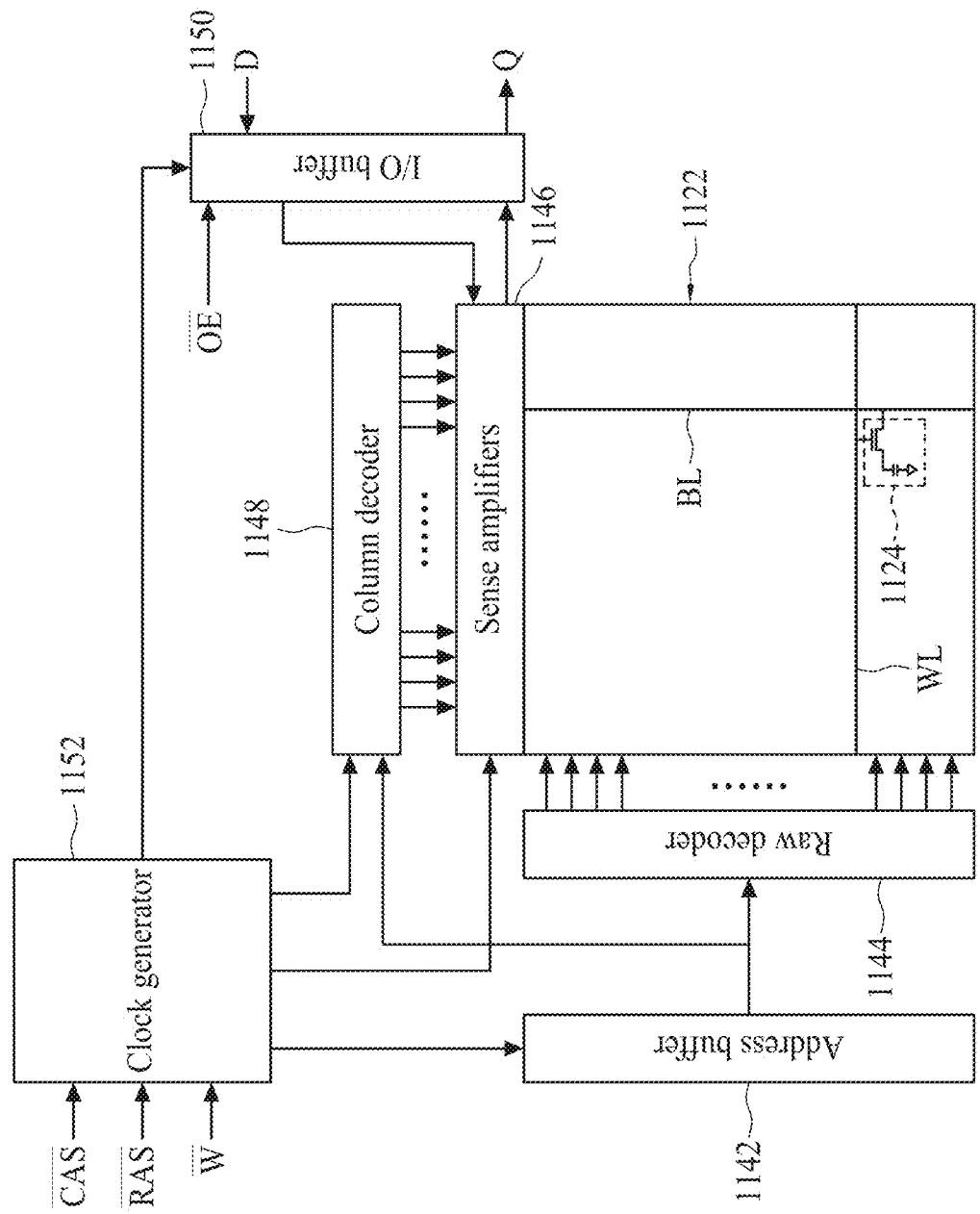
FIG. 3 is a block diagram of a dynamic random-access memory in accordance with some embodiments of the present disclosure.

Referring to FIG. 3, in some embodiments, the memory cell 1124 is arranged at an intersection of a word line WL and a bit line BL. The peripheral circuits that are used to access data stored in the memory cells 1124 may include, but are not limited to, an address buffer 1142, a row decoder 1144, multiple sense amplifiers 1146, a column decoder 1148, an input/output (I/O) buffer 1150, and a clock generator 1152. The address buffer 1142 takes an external applied address for selecting one of the memory cells 1124 in the memory cell array 1122 and generates an internal row address and an internal column address in response to the external applied address.

The row decoder 1144, which decodes the internal row address for selecting a row (word line) specified by the internal row address, is electrically coupled to the address buffer 1142 and the word lines WL. The sense amplifiers 1146, electrically coupled to the I/O buffer 1150 and the bit lines BL, are configured to detect and amplify data of the memory cell 1124 connected to the word line WL selected by the row decoder 1144. The column decoder 1148, electrically coupled to the sense amplifiers 1146, uses the internal row address from the address buffer 1142 to select a corresponding column (bit line) in the memory cell array 1122.

The clock generator 1152 is electrically coupled to the address buffer 1142, the sense amplifiers 1146, the column decoder 1148 and the I/O buffer 1150. The clock generator 1152 can be an electronic oscillator that produces a clock signal for use in synchronizing operation of the peripheral circuits of the integrated circuit.

During a read operation, one of the sense amplifiers 1146 amplifies a voltage difference arising in a selected bit line in accordance with stored data of a selected memory cell 1124 and outputs an amplified result as read data to an external device via the I/O buffer 1150. During a write operation, in accordance with write data input via the I/O buffer 1150, a differential voltage having a predetermined amplitude is generated on a selected bit line, and the write data is thereby stored in a selected memory cell 1124.

Referring again to FIG. 2, in some embodiments, each of the array zones 112 is surrounded by one of the peripheral zones 114. In addition, each of the peripheral zones 114 may optionally include a seal ring 116 around a respective array zone 112 to prevent cracks from propagating into the respective array zone 112 of the substrate 10 during the separation of the die regions 110.

Commonly, the integrated circuit is confined to the die region 110 and does not extend into or across the first and second scribe lines 120 and 130 where the substrate 10 will be sawed. However, some reliability and functionality metrology marks are deployed in the first and second scribe lines 120 and 130 to measure and characterize structural variations at wafer level. Specifically, on product wafers 140, the metrology mark is placed in the first and second scribe lines 120 and 130 for obtaining various physical characteristics and performance metrics associated with at least one particular process node.

By way of example, an overlay metrology mark 200, used to correct an alignment in order to keep overlay errors within desired limits, can be formed in the first and second scribe lines 120 and 130, which permits the overlay metrology mark 200 to be placed on the wafer 140 without taking up space intended for the integrated circuit. In some embodiments, the overlay metrology mark 200 is suitable for an image-based overlay measurement technique. Notably, when the dicing operation is performed, the overlay metrology mark 200 in the first and second scribe lines 120 and 130 is destroyed.

The overlay metrology mark 200 can include a first axis 210, a second axis 212, a target feature 214, a first alignment feature 215a and a second alignment feature 215b. The first axis 212 extends in the first direction D1, and the second axis 212 extends in a second direction D2 orthogonal to the first direction D1. The target feature 214 having a cross shape is disposed at an intersection of the first axis 210 and the second axis 212. The first alignment feature 215a is arranged on the first axis 210, and the second alignment feature 215b is arranged on the second axis 212.

Figure 4:
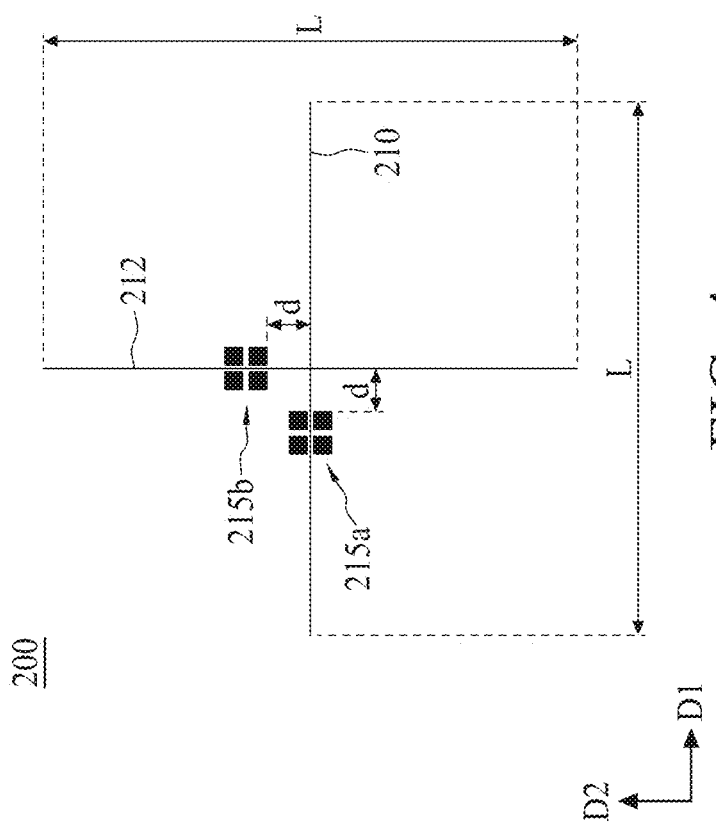
FIG. 4 is a top view of a first axis, a second axis, a first alignment feature and a second alignment feature in accordance with some embodiments of the present disclosure.

In addition, the first alignment feature 215a and the second alignment feature 215b are in pairs for determining an overlay error between two successive layers of the substrate 10. As illustrated in FIG. 4, a shortest distance d between the first axis 210 and the second alignment feature 215b is equal to a shortest distance d between the second axis 212 and the first alignment feature 215a.

It is generally believed that a size of the overlay metrology mark 200 should be as large as possible so as to maximize an amount of information used for overlay measurements. However, upper limits of the size of the overlay metrology mark 200 may be determined by a field of view of a metrology tool (not shown) used to measure overlay and/or scribe line budget. The field of view generally refers to an optical perimeter that defines an area available for capturing an image of the overlay metrology mark 200 by the metrology tool, and the scribe line budget generally refers to the available space allowed by the 1o first and second scribe lines 120 and 130 for placement of the overlay metrology mark 200. For example, the first and second axes 210 and 212 can have a length L not greater than 28 micrometers. In some embodiments, the length L of the first and second axes 210 and 212 is about 15 micrometers.

Figure 5:
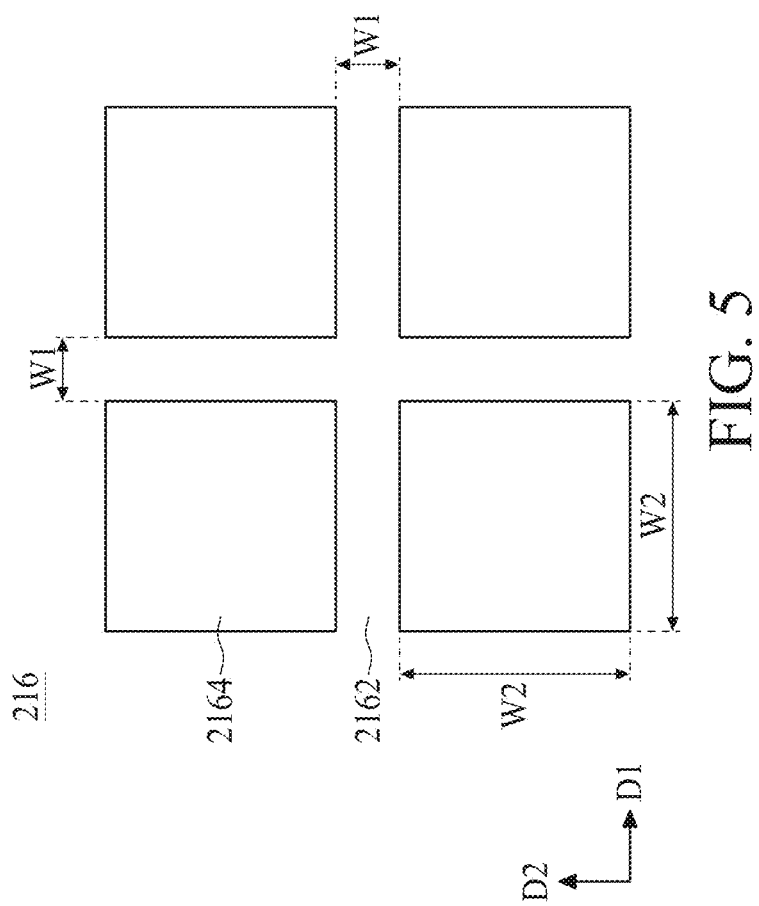
FIG. 5 is a top view of an alignment feature in accordance with some embodiments of the present disclosure.

FIG. 5 is a top view of the alignment feature 216 in accordance with some embodiments of the present disclosure. The geometry of the alignment features 216 is configured to find a proper balance between an image resolution of the metrology tool and a robustness of the process. Referring to FIG. 5, the alignment features 216 have a square profile. However, a size and a shape of the alignment features 216 may be widely varied. For example, the alignment features 216 may form shapes such as circles, triangles, rectangles, polygons and the like.

In some embodiments, each of the alignment features 216 is separated into quarters by void zones 2162 having a first width W1. In some embodiments, the alignment features 216 are composed of multiple square micro-structures 2164 separated by a pair of void zones 2162 crossing each other. As illustrated in FIG. 5, the micro-structures 2164 have a second width W2 greater than the first width W1. Notably, a lower limit of a characteristic dimension of each micro-structure 2164 is determined by the resolution limit of the metrology tool.

Figure 6:
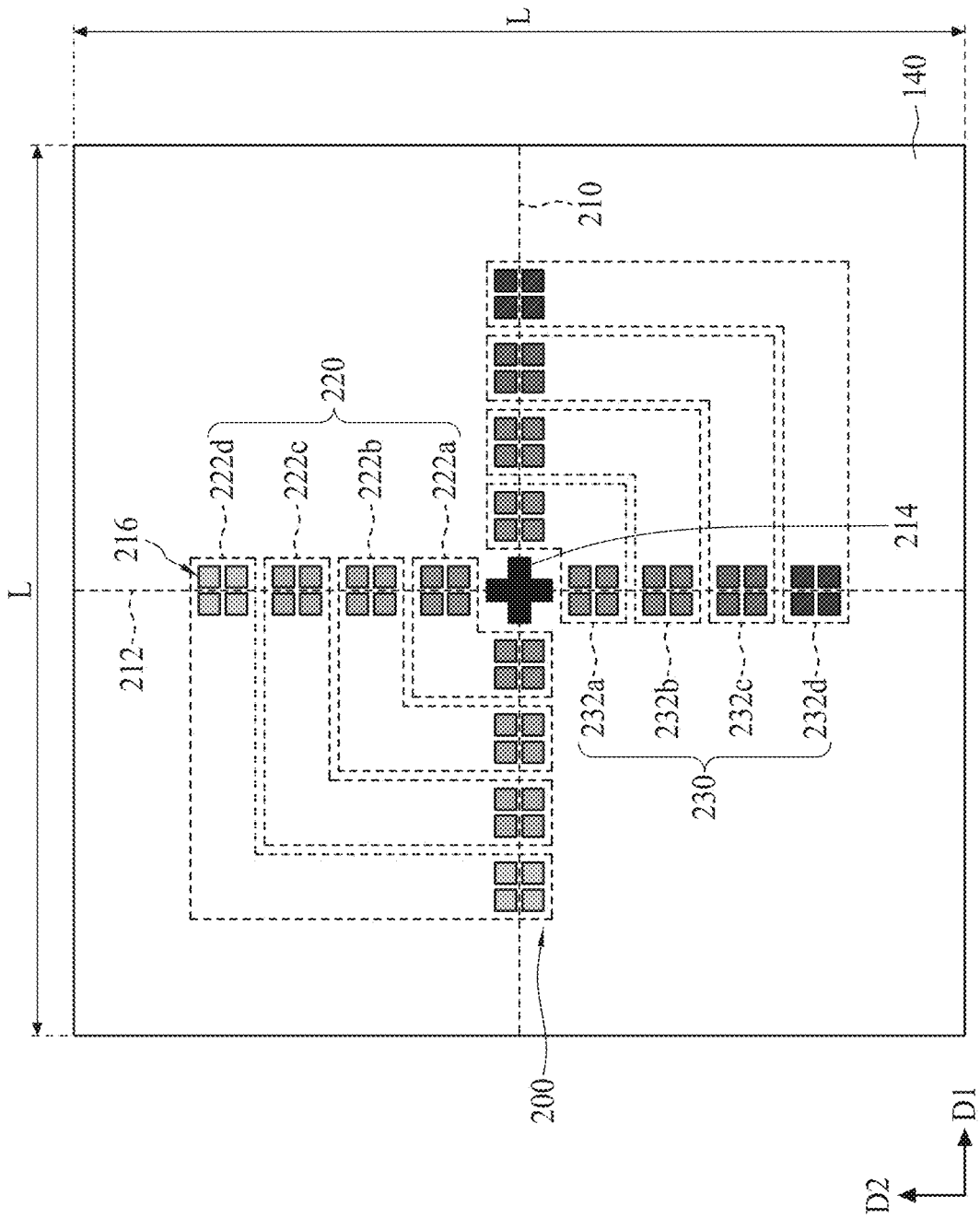
FIG. 6 is a top view of an overlay metrology mark for aligning different layers over a wafer in accordance with some embodiments of the present disclosure.

FIG. 6 is a top view of the overlay metrology mark 200 for aligning different layers over the wafer 140 in accordance with some embodiments of the present disclosure. Referring to FIG. 6, the overlay metrology mark 200 can include a first axis 210, a second axis 212, a target feature 214 and a plurality of alignment features 216. The first axis 210 extends in the first direction D1, the second axis 212 extends in the second direction D2, and the first axis 210 crosses the second 1o axis 212 at a right angle. The target feature 214 is disposed at an intersection of the first axis 210 and the second axis 212.

Figure 7:
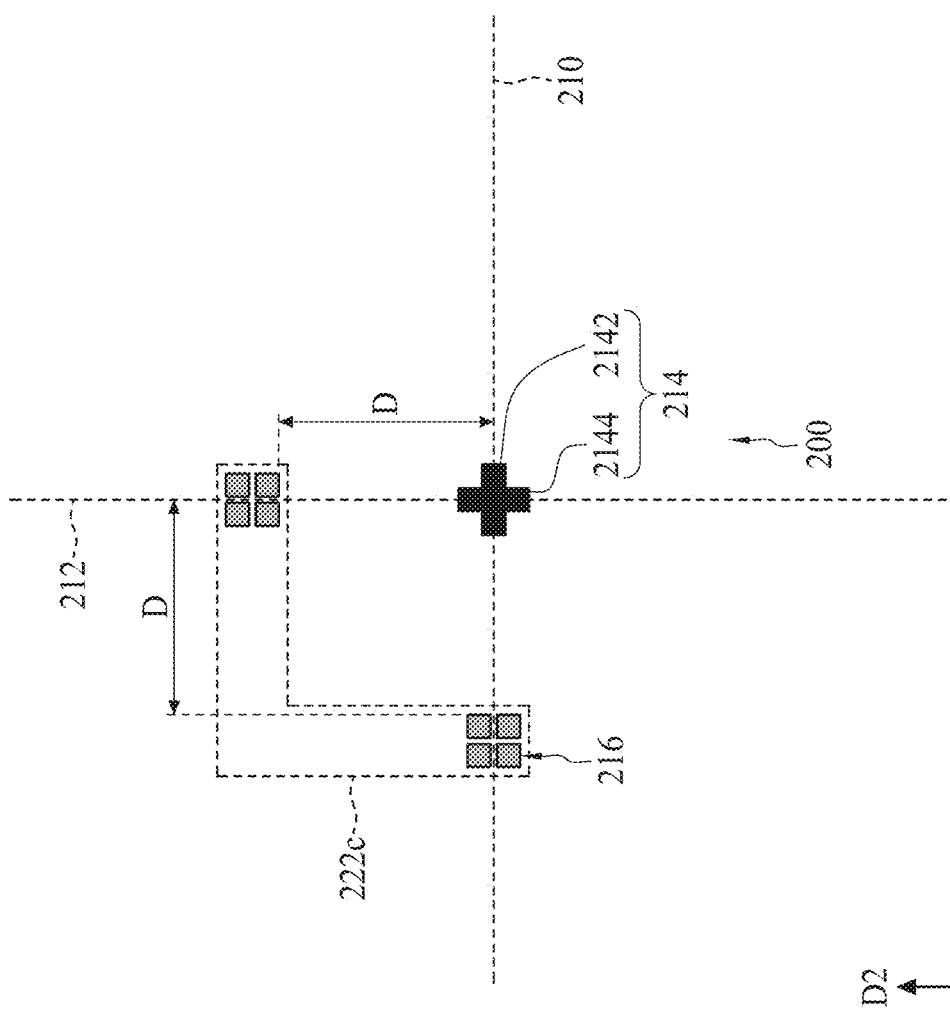
FIG. 7 is a top view of an overlay metrology mark for measuring an overlay error in accordance with some embodiments of the present disclosure.

In some embodiments, the target feature 214 may be composed of two line segments 2142 and 2144 (as shown in FIG. 7) intersecting in an X shape. Referring again to FIG. 6, the alignment features 216 are arranged along the first and second axes 210 and 212 with an equal distance between adjacent pairs of the alignment features 216. In other words, a distance between adjacent pairs of alignment features is a constant. Referring to FIGS. 6 and 7, some of the alignment features 216 are disposed on either side of the line segment 2142 of the target feature 214, and the other alignment features 216 are disposed on either side of the line segment 2144 of the target feature 214. In some embodiments, the overlay metrology mark 200 has a cruciform profile.

Referring again to FIG. 6, the overlay metrology mark 200 can be separated into segments for purposes of analysis. Any number of segments can be used for such analysis of the overlay errors. In some embodiments, the overlay metrology mark 200 is separated into four segments. More particularly, the first axis 210 may separate the second axis 212 into two equal segments, i.e., an upper segment and a lower segment. Similarly, the second axis 212 may separate the first axis 210 into two equal segments, i.e., a left segment and a right segment.

The alignment features 216 are grouped according to their locations and into a first alignment group 220 and a second alignment group 230. For example, the first alignment group 220 can comprise the alignment features 216 disposed at the left segment of the first axis 210 and at the upper segment of the second axis 212, and the second alignment group 230 can comprise the alignment features 216 disposed 1o at the right segment of the first axis 210 and at the lower segment of the second axis 212.

Figure 8:
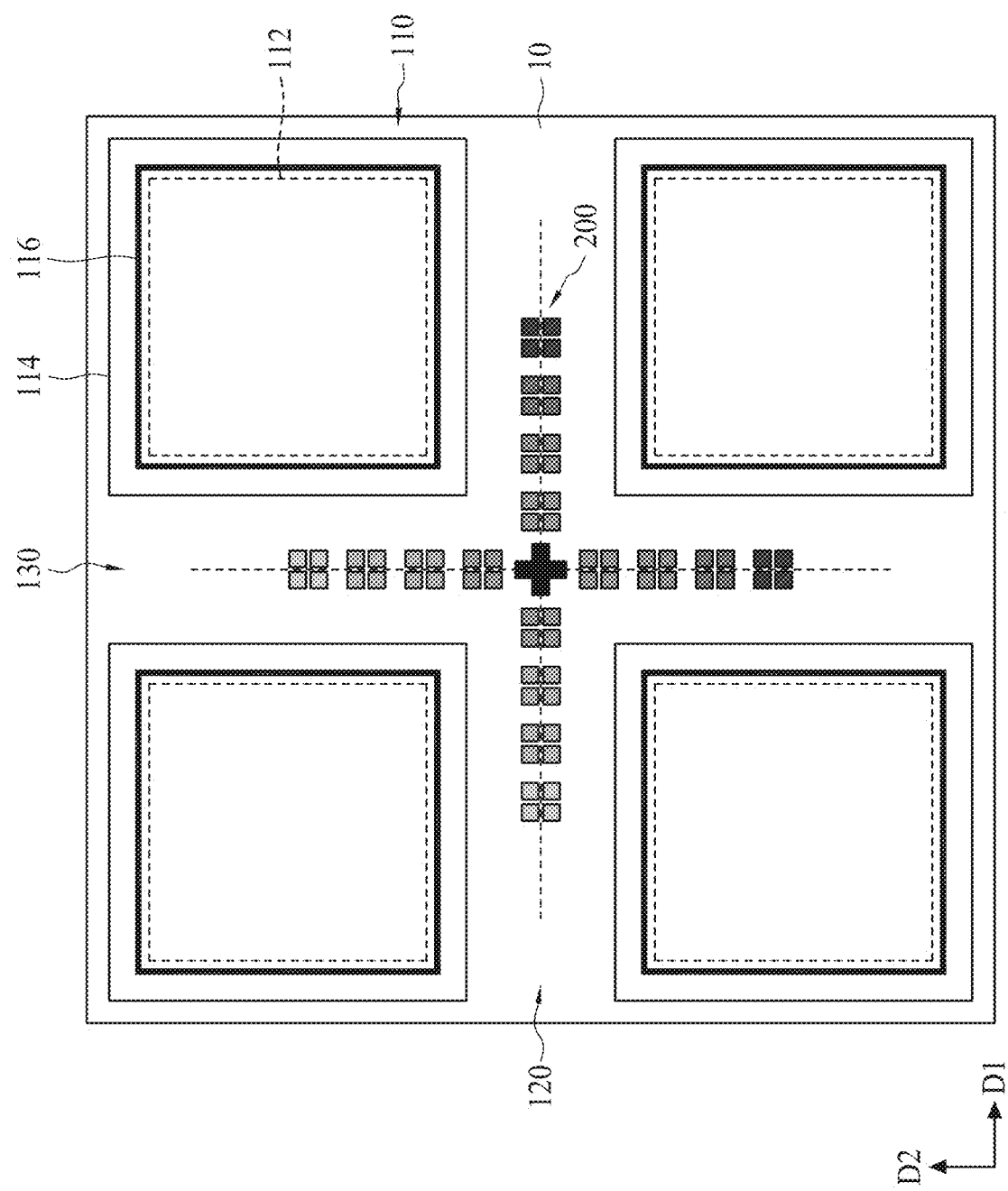
FIG. 8 is top view of a portion of a substrate including die areas and an overlay metrology mark.

In some embodiments, the alignment features 216 of the first alignment group 220 can be applied to determine whether the overlay error exists in the array zone 112 (as shown in FIG. 8), and the alignment features 216 of the second alignment group 230 may be applied to determine whether the overlay error exists in the peripheral zone 114. A number of the alignment features 216 at each segment may be widely varied. As shown, the number of the alignment features 216 at each segment is same as the number of the alignment features 216 in the other segments; therefore, the overlay metrology mark 200 may have a reflectional symmetry and a rotational symmetry.

Referring again to FIG. 6, the alignment features 216 in the array zone 112 or the peripheral zone 114 are paired for the measurement of the overlay errors at different layers of the substrate 10. In some embodiments, the alignment feature 216 disposed at the first axis 210 and separated from the second axis 212 by a predetermined distance D and the alignment feature 216 disposed at the second axis 212 and separated from the first axis 210 by the predetermined distance D are paired for the measurement of overlay, as shown in FIG. 7. In brief, the alignment features 216 separated from the intersection of the first and second axes 210 and 212 by the same shortest distance and in a same alignment group are paired to determine relative positions of two successive patterned layers of the substrate 10.

As illustrated in FIGS. 5 and 7, the first axis 210 is designed to extend through the horizontal void zone 2162 of the alignment feature 216 arranged at the first axis 210, and the second axis 212 is designed 1o to extend through the longitudinal void zone 2162 of the alignment feature 216 arranged at the second axis 212 to facilitate the measurement of the overlay error.

Referring again to FIG. 6, the first and second alignment groups 220 and 230 respectively include four pairs of alignment features 222a to 222d and 232a to 232d. Notably, the alignment features 216 indicated by different shades of gray may represent the alignment features 216 disposed at different layers of the substrate 10. A first pair of the alignment features 222a, closest to the target feature 214, can be applied to determine whether overlay errors exist in an array active area (i.e., an active area in the array zone 112); a second pair of the alignment features 222b can be applied to determine whether the overlay error exists in bit line contacts; a third pair of the alignment features 222c can be applied to determine whether the overlay error exists in the word lines; and a fourth pair of the alignment features 222d, farthest from the target feature 214, can be applied to determine whether the overlay error exists in the bit lines.

Additionally, a fifth pair of the alignment features 232a, closest to the target feature 214, may be applied to determine whether the overlay error exists in an array area of the peripheral zone 114; a sixth pair of the alignment features 232b may be applied to determine whether the overlay error occurs in at least one gate conductor in the peripheral zone 114; a seventh pair of the alignment features 232c may be applied to determine whether the overlay error exists in at least one contact support; and an eighth pair of the alignment features 232d, farthest from the target feature 214, may be applied to determine whether the overlay error exists in at least one PFET contact. It may be observed that the alignment features 216 disposed close to the target feature 214 are formed over the wafer 140 prior to formation of the alignment features 216 disposed far away from the target feature 214.

Figure 9:
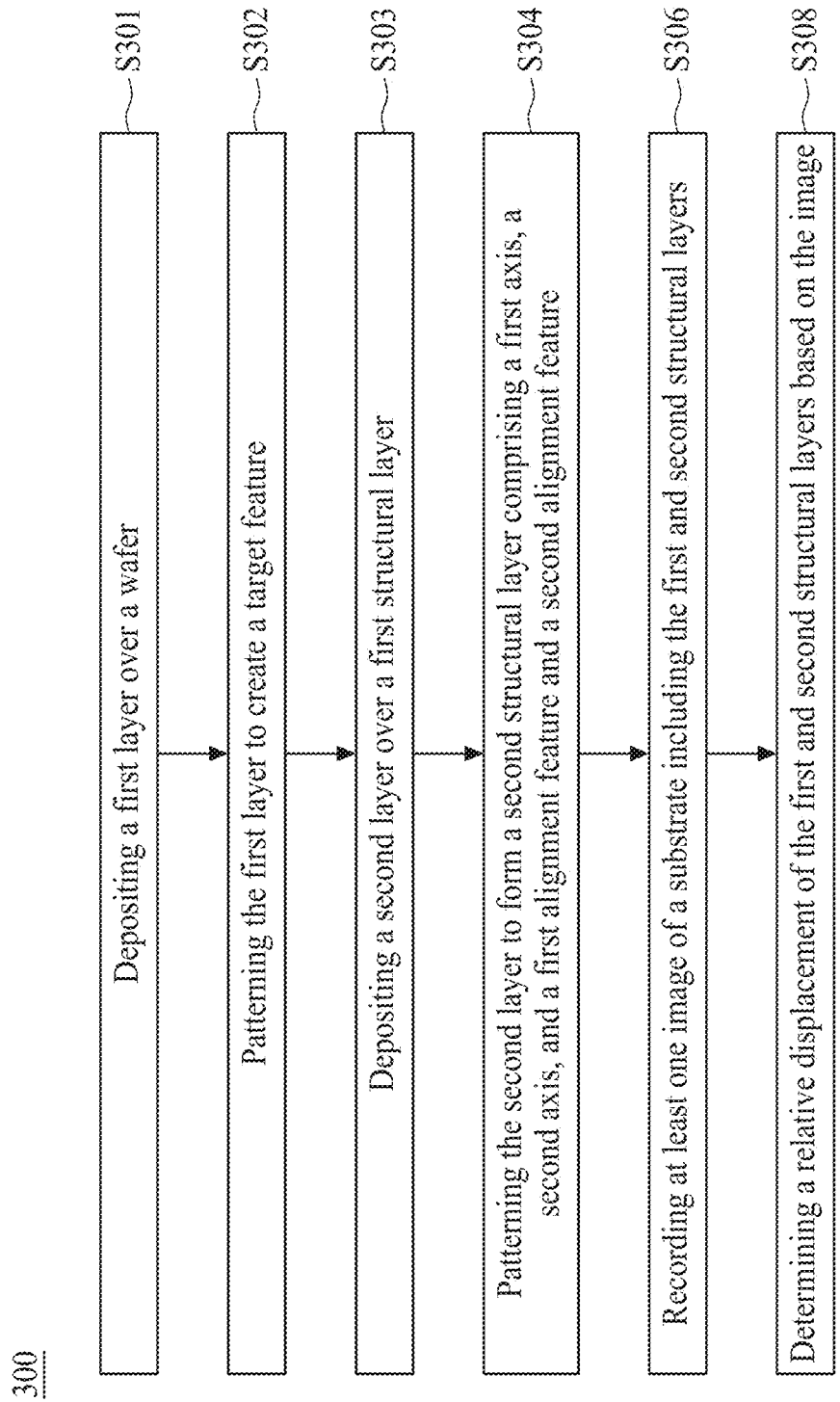
FIG. 9 is a flow diagram illustrating a method of determining an overlay error during a semiconductor process in accordance with some embodiments of the present disclosure.
Figure 10:
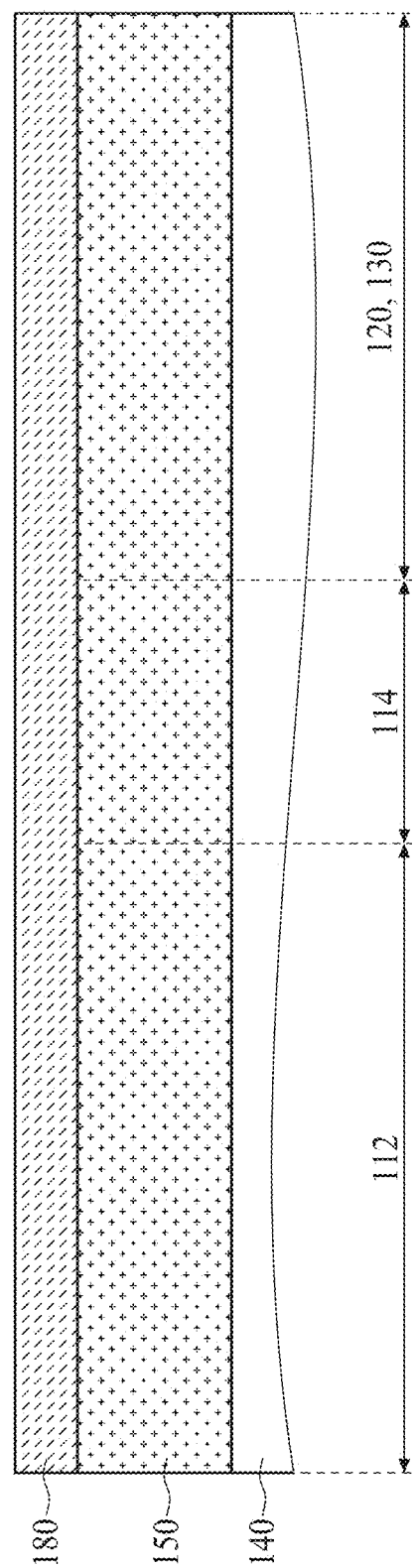
FIG. 10 is a cross-sectional view of an intermediate stage in the formation of an overlay metrology mark in accordance with some embodiments of the present disclosure.

FIG. 9 is a flow diagram illustrating a method 300 of determining an overlay error during a semiconductor process in accordance with some embodiments of the present disclosure, and FIG. is a cross-sectional view of an intermediate stage in the determination of the overlay error during the semiconductor process in accordance with some embodiments of the present disclosure. Referring to FIGS. 9 and 10, the method 300 of determining the overlay error during the semiconductor process can begin at step S301, in which a first layer 150 is deposited on a wafer 140. The wafer 140 may typically be a silicon wafer. The wafer 140 may include various doping configurations depending on design requirements as known in the art. The wafer 140 may also include other elementary semiconductors such as germanium. Alternatively, the wafer 140 may include compound semiconductors and/or alloy semiconductors.

Figure 11:
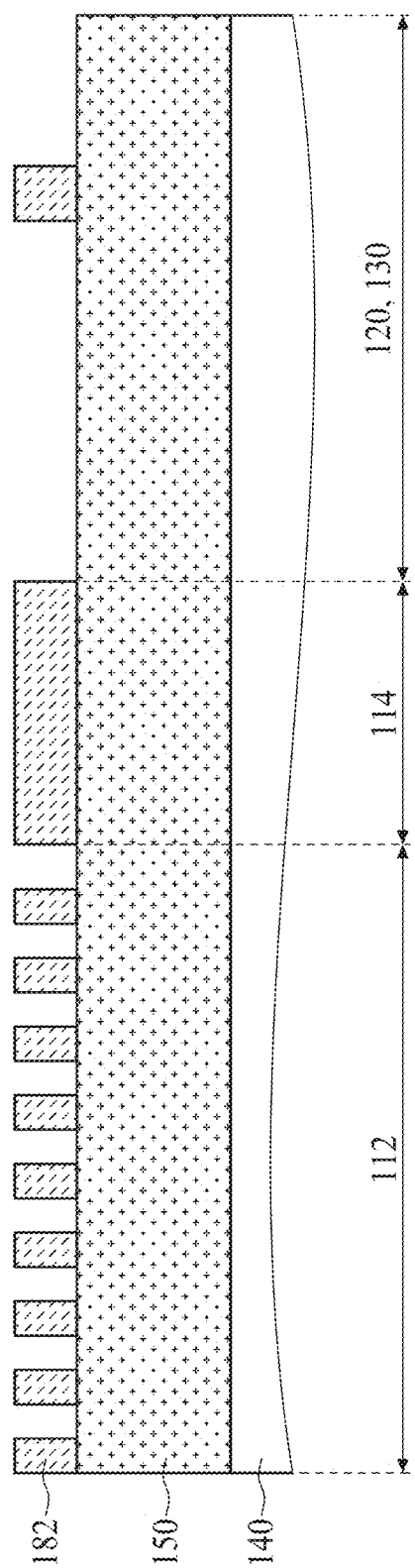
FIG. 11 is a cross-sectional view of an intermediate stage in the formation of an overlay metrology mark in accordance with some embodiments of the present disclosure.
Figure 12:
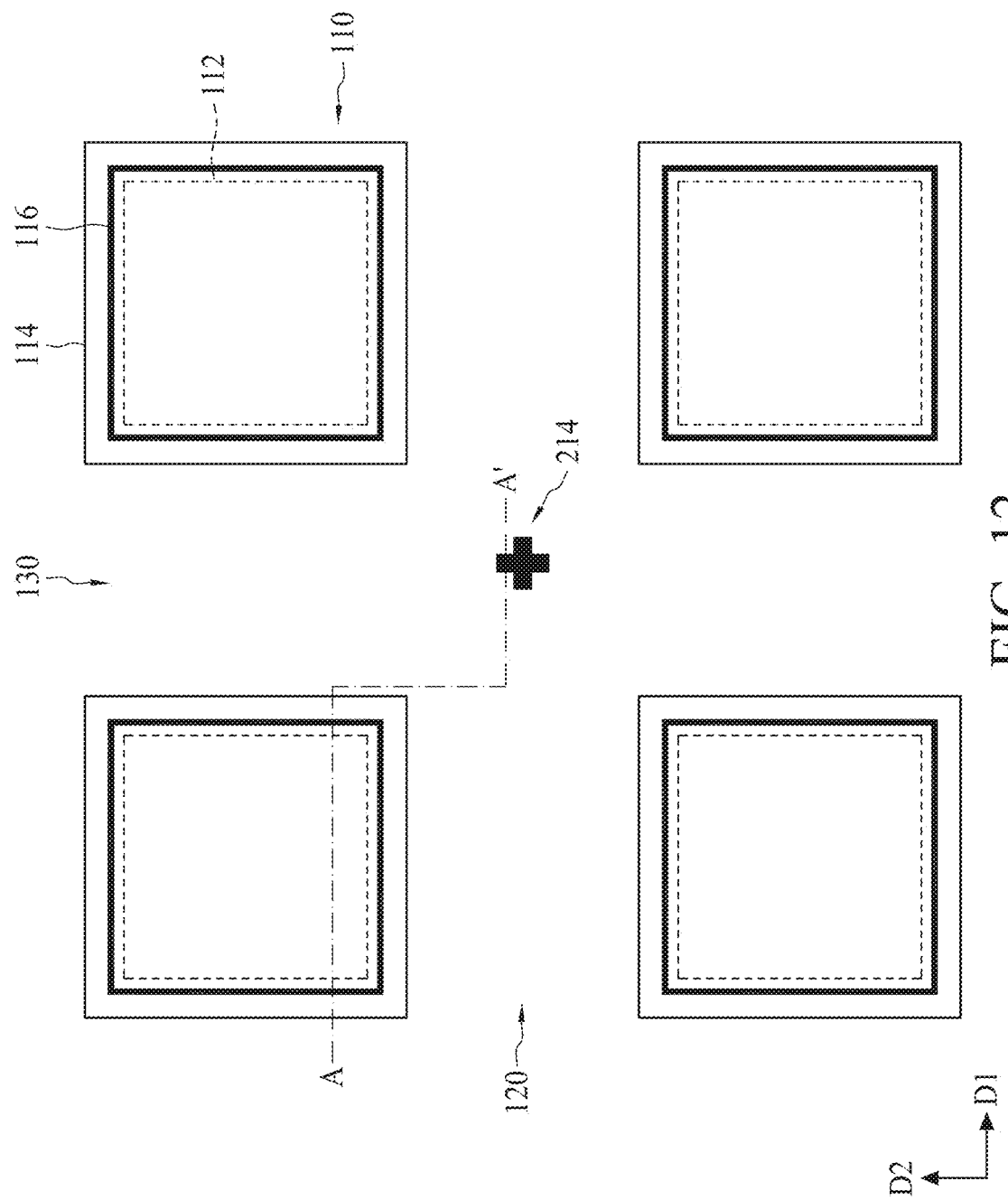
FIG. 12 is a top view of an intermediate stage in the formation of an overlay metrology mark in accordance with some embodiments of the present disclosure.
Figure 13:
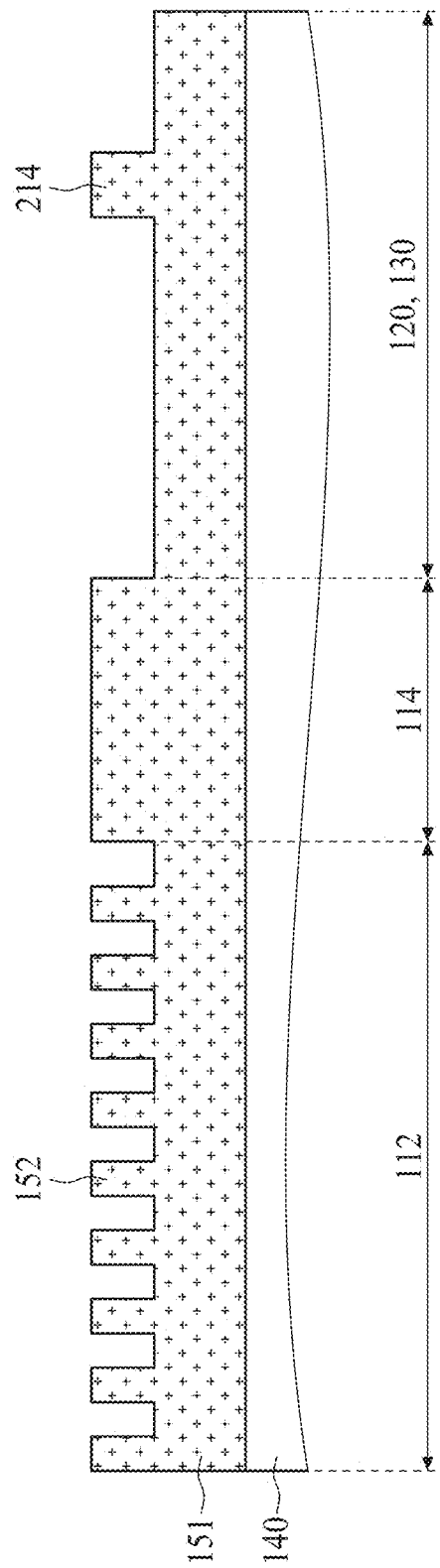
FIG. 13 is a cross-sectional view taken along a line A-A' illustrated in FIG. 12.

After the deposition of the first layer 150, a photoresist layer 180 is applied over the entire wafer 140 by a spin-coating process and then dried using a soft-baking process. The photoresist layer 180, including photosensitive material, is then exposed and developed to form a feature pattern 182, shown in FIG. 11, to expose portions of the first layer 150. Next, the method 300 then proceeds to a step S302, a patterning process is performed to etch the first layer 150 through the feature pattern 182 and thus form a first structural layer 151 comprising a target feature 214 (as shown in FIGS. 12 and 13). The feature pattern 182 is removed after the target feature 214 is created using an ashing process or a wet strip process, for example.

Referring to FIG. 12, the wafer 140 includes a plurality of die regions 110 partitioned by first and second scribe lines 120 and 130. Various devices including transistors, diodes, capacitors, resistors, fuses or the like are formed in the die regions 110, respectively. The first structural layer 151, for the formation of the devices, includes first patterned structures 152 in an array zone 112 and the target feature 214 in the scribe lines 120 and 130. The target feature 214 is formed in the first and second scribe lines 120 and 130 using same processes as those used to form the first patterned structures 152 in the array zone 112. In other words, the target feature 214 is formed as part of the process for fabricating the first patterned structures 152, permitting testing and verification of the processes without contaminating or interfering with production of the patterned structures 152. In some embodiments, the first structural layer 150 may be formed during front-end-of-line (FEOL) processes.

Figure 14:
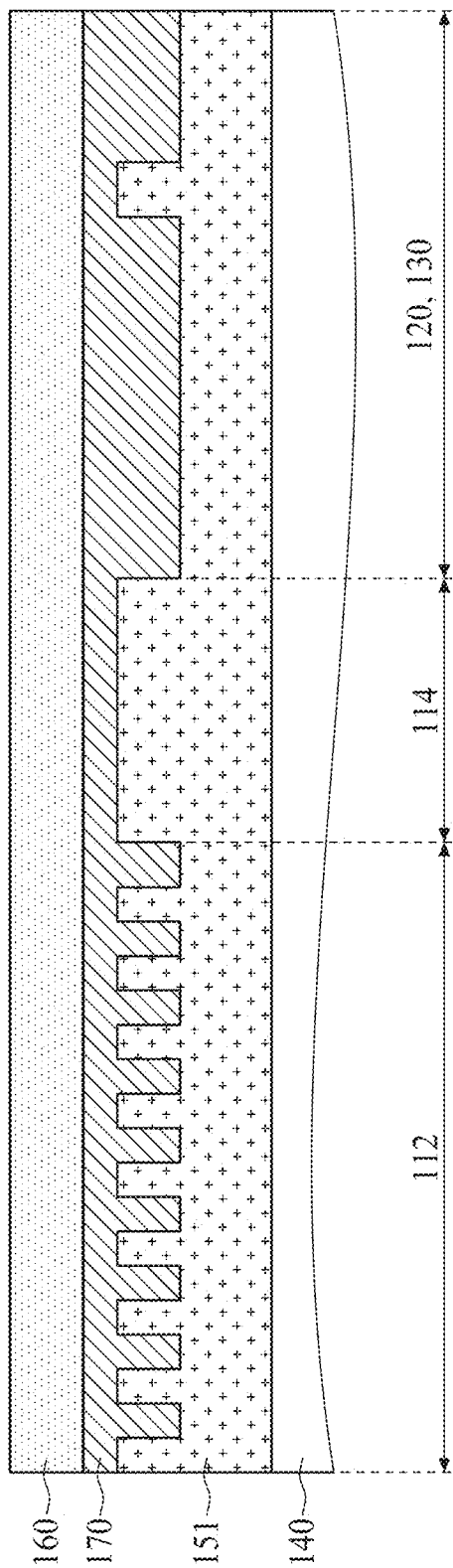
FIG. 14 is a cross-sectional view of an intermediate stage in the formation of an overlay metrology mark in accordance with some embodiments of the present disclosure.
Figure 15:
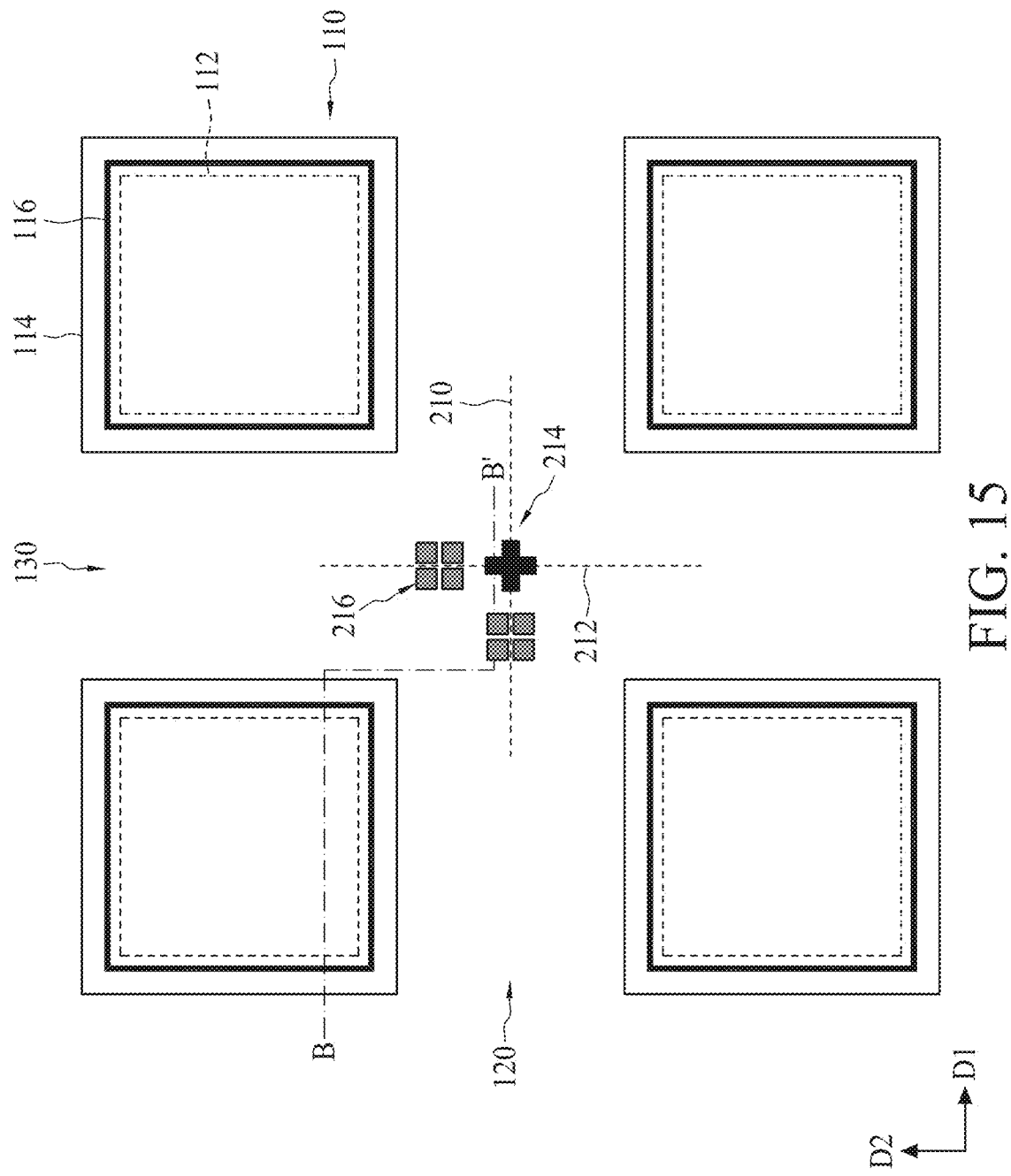
FIG. 15 is a top view of an intermediate stage in the formation of the overlay metrology mark in accordance with some embodiments of the present disclosure.
Figure 16:
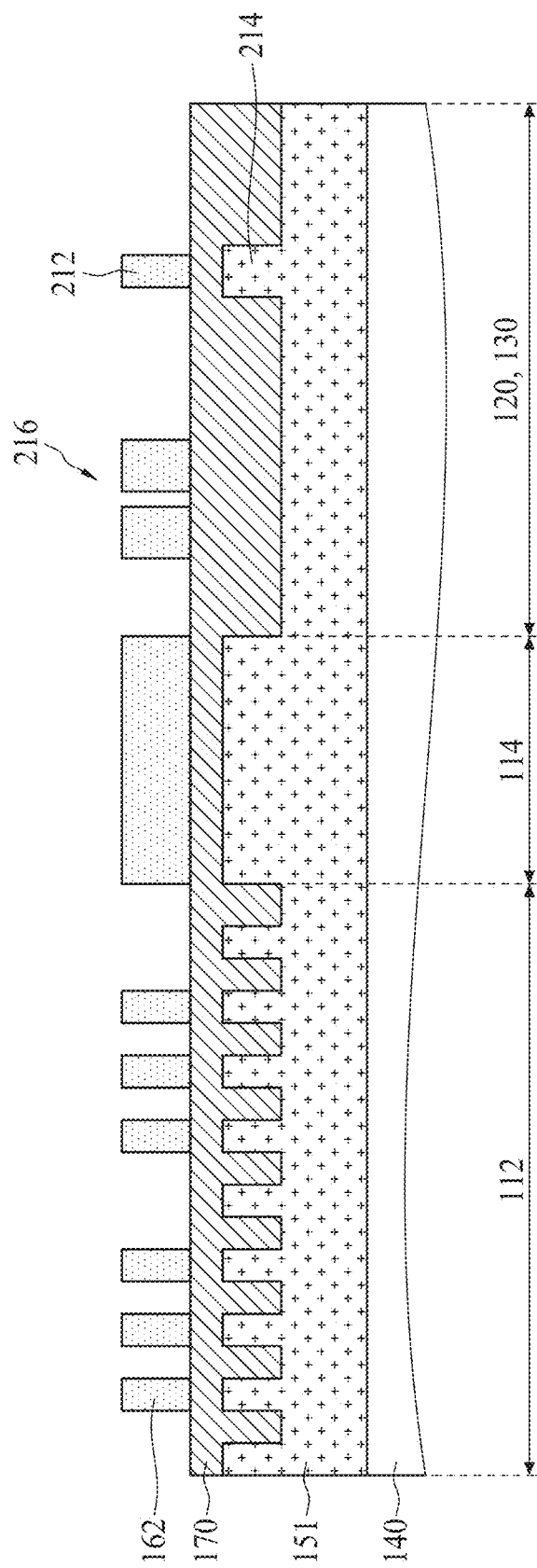
FIG. 16 is a cross-sectional view taken along a line B-B' illustrated in FIG. 15.

Referring to FIGS. 9 and 14, the method 300 then proceeds to a step S303, in which a second layer 160 is deposited over the first structural layer 151. In some embodiments, a third layer 170 is optionally deposited on the first structural layer 151 prior to the deposition of the second layer 160. The second layer 160 may include photoresist material. Subsequently, portions of the second layer 160 is exposed to radiation (not shown) and then developed to thereby forming a second structural layer 162, as shown in FIGS. 15 and 16, including a first axis 210, a second axis 212 and a pair of alignment features 216 located in the first and second scribe lines 120 and 130. In other words, the second structural layer 162 is formed using a lithography process. In some embodiments, the second structural layer 160 may be a pattern which will be used to protect portion of the third 1o layer 170 during etching.

As illustrated in FIGS. 15, the first axis 210 crosses the second axis 212, and the pair of alignment features 216 are disposed at the first axis 210 and the second axis 212. In detail, the first axis 210 extends along a first direction D1 and the second axis 212 extends along a second direction D2 substantially perpendicular to the first direction D1. Additionally, the first axis 210 crosses the second axis 212 at a right angle. Furthermore, one of the alignment features 216 is disposed at the first axis 210, and the other alignment feature 216 is disposed at the second axis 212.

The first axis 210 bisects one of the alignment features 216 disposed thereon, and the second axis 212 bisects the other alignment feature 216 disposed thereon. In the other words, the first axis 210 and the second axis 212 function as reference lines for the measurement of the overlay.

After formation of an overlay metrology mark including the first axis 210, the second axis 212, the target feature 214 and the pair of the alignment features 216, a metrology tool (not shown) is provided to record an image of the first axis 210, the second axis 212, the target feature 214 and the alignment features 216 (step S306). Notably, the second structural layers 162 and the third layer 170 are optically transparent and allow light to pass through without appreciable scattering of the light if a relative displacement of the first structural layer 151 and the second structural layer 162 is determined using the metrology tool.

The method 300 then proceeds to a step S308, in which a relative displacement of the first structural layer 151 and the second 1o structural layer 162 can be determined using a position of the alignment feature 216 relative to the target feature 214. In some embodiments, the overlay measurement is performed immediately after the second structural layer 162 including photoresist material is developed, i.e., the photoresist is developed away in the area where it was exposed to the light, thus leaving the overlay pattern in the photoresist.

In the present disclosure, the first axis 210 and the second axis 212 are oriented relative to the alignment features 216. Therefore, a determination of how accurately the first structural layer 150 aligns with the second structural layer 160 can be accomplished by comparing a position of the first axis 210 relative to the target feature 214 and comparing a position of the second axis 212 relative to the target feature 214. Alternatively, the determination of how accurately the first structural layer 150 aligns with the second structural layer 160 can be accomplished by comparing an intersection of the first and second axes 210 and 212 relative to the target feature 214.

Referring to FIGS. 15 and 16, in some embodiments, the first structural layer 151 and the second structural layer 162 are properly aligned once the first axis 210 and the second axis 212 extend through the target feature 214. Alternatively, it is determined that the first structural layer 151 and the second structural layer 162 are properly aligned when an intersection of the first axis 210 and the second axis 212 overlaps the target feature 216.

Figure 17:
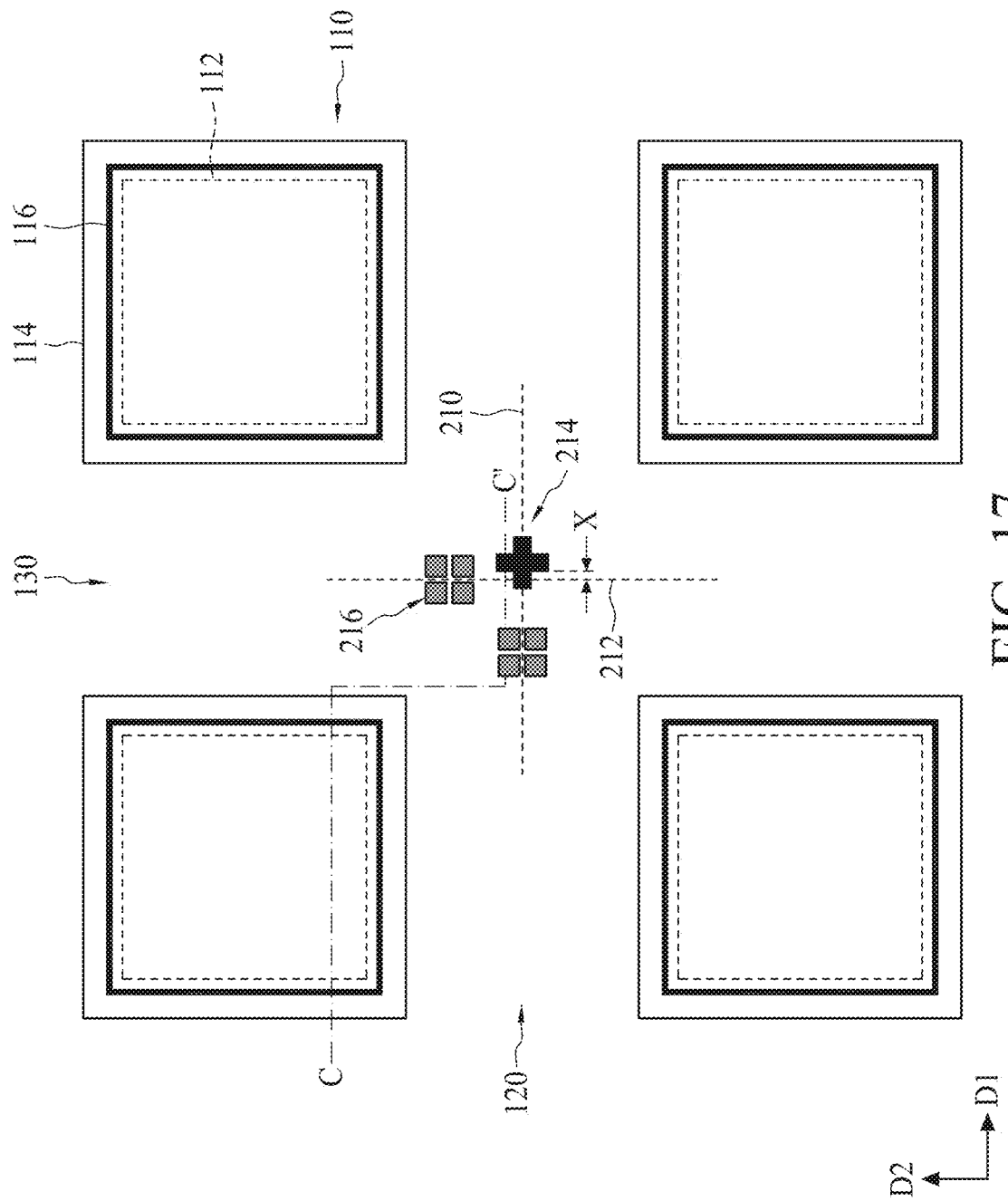
FIG. 17 is a top view of an intermediate stage in the formation of an overlay metrology mark in accordance with some embodiments of the present disclosure.
Figure 18:
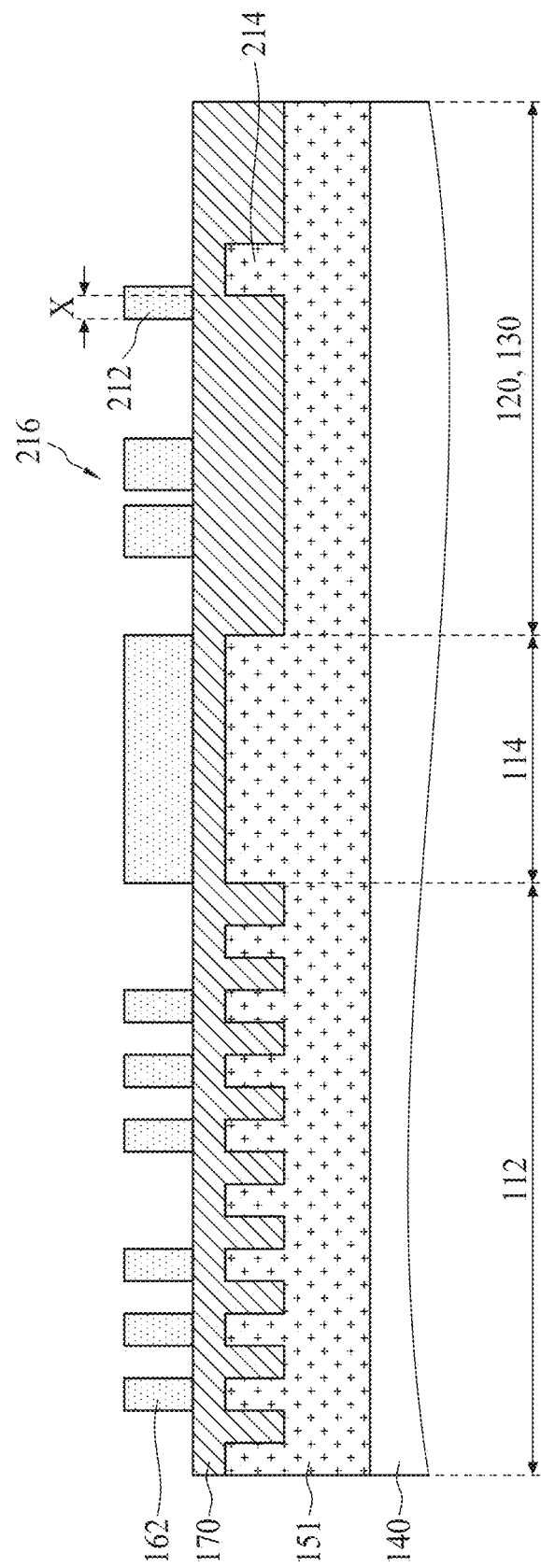
FIG. 18 is a cross-sectional view taken along a line C-C' illustrated in FIG. 17.
Figure 19:
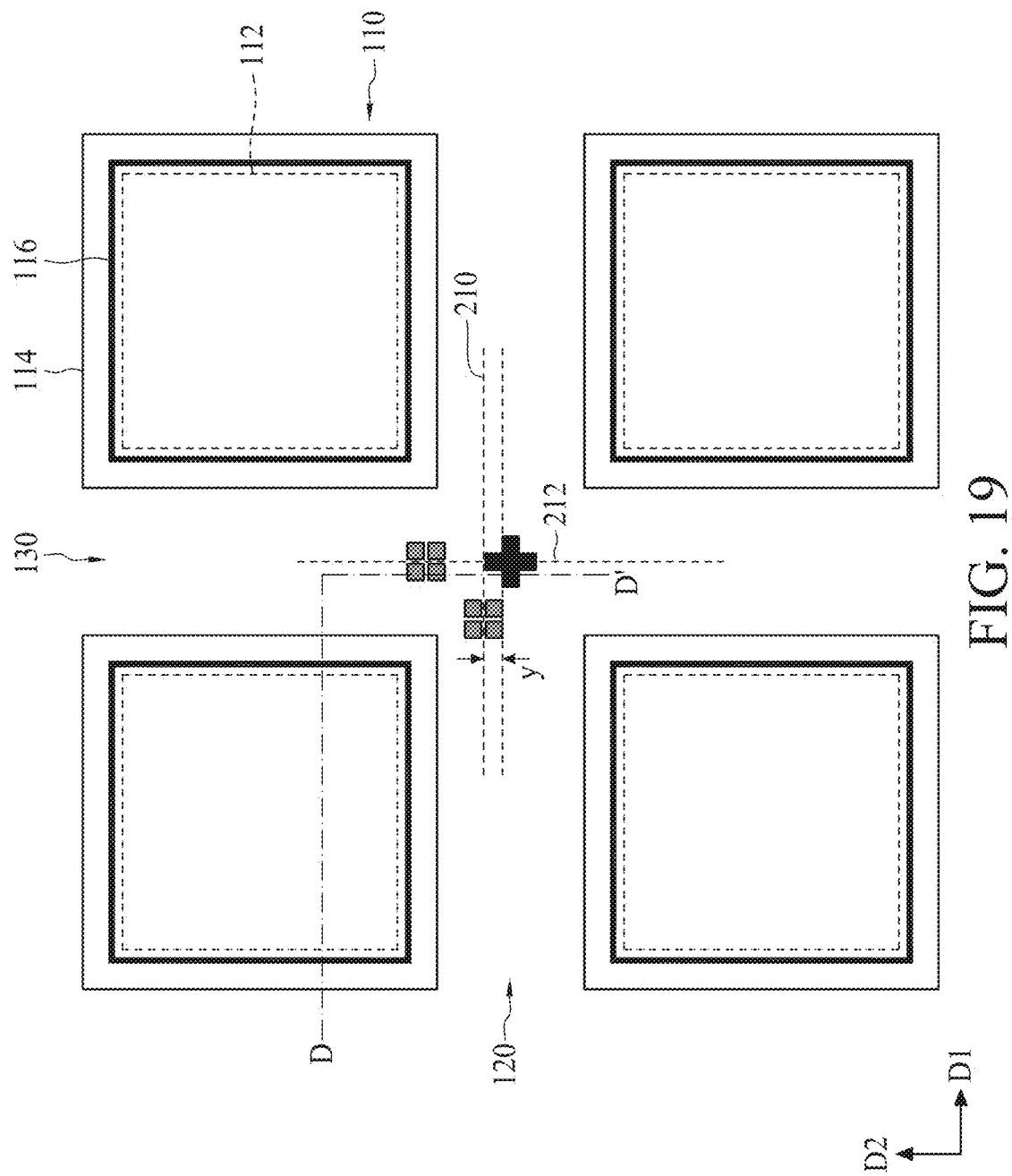
FIG. 19 is a top view of an intermediate stage in the formation of an overlay metrology mark in accordance with some embodiments of the present disclosure.
Figure 20:
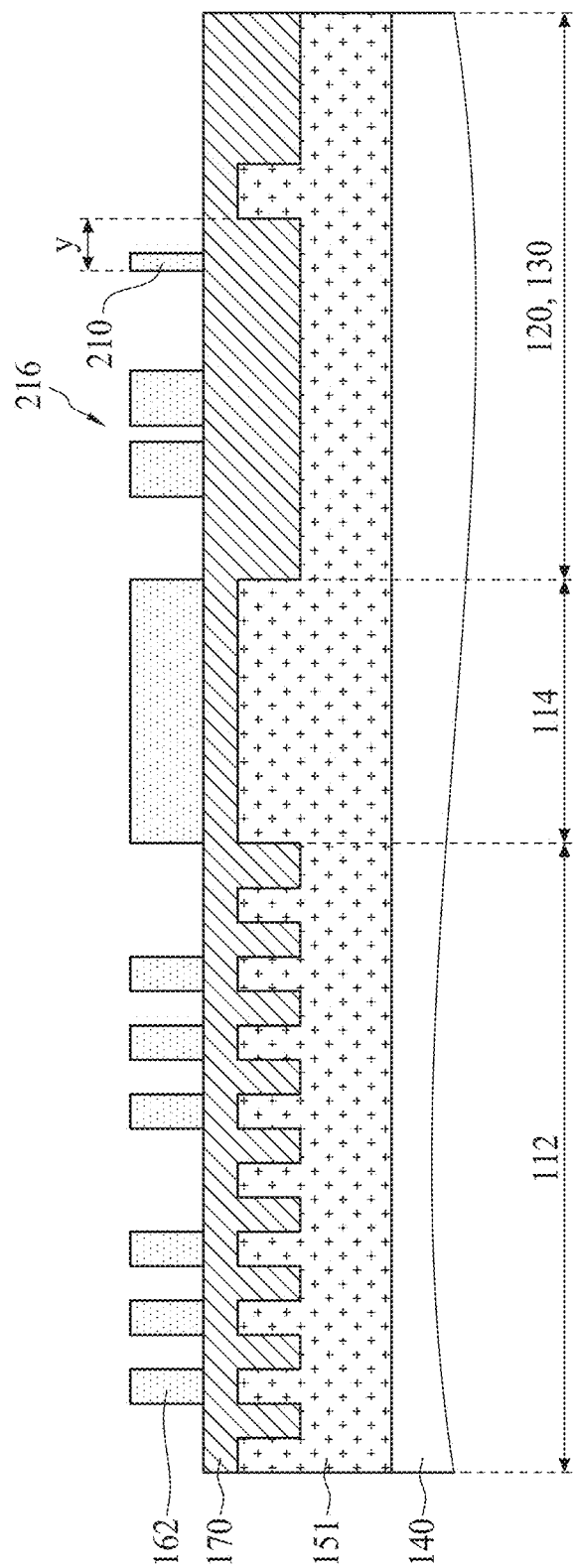
FIG. 20 is a cross-sectional view taken along a line D-D' illustrated in FIG. 19.

Referring to FIGS. 17 and 18, the second structural layer 162 is not properly aligned with the first structural layer 151 since a displacement x exists between the second axis 212 and the target feature 214. Referring to FIGS. 19 and 20, the second structural layer 162 is not properly aligned with the first structural layer 151 since a displacement y exists between the second axis 212 and the target feature 214. In other words, the overlay error exists in the first and second structural layers 151 and 162.

In general, a greater overlay error leads to greater misalignment of the first and second structural layers 151 and 162. If the overlay error is too great, performance of a manufactured integrated circuit may be compromised; therefore, the substrate 10 having unacceptable overlay error can be reworked by removing and re-depositing a re-exposed and re-developed photoresist. Reworking is typically undesirable, but it is better than scrapping the wafer 140 altogether.

In conclusion, with the configuration of the overlay metrology mark 200 including the first axis 210 and the second axis 212 extending through centers of the alignment feature 216, the overlay measurement for correcting the process in order to keep the overlay errors within desired limits can be effectively and rapidly accomplished.

One aspect of the present disclosure provides an overlay metrology mark. The overlay metrology mark comprises a first axis, a second axis, a target feature, first alignment feature and a second alignment feature. The second axis crosses the first axis. The target feature is disposed at an intersection of the first axis and the second axis. The first alignment feature is arranged on the first axis, the second alignment feature is arranged on the second axis, and the first alignment feature and the second alignment feature are in pair.

One aspect of the present disclosure provides an overlay metrology mark for determining relative positions of two or more successive patterned layers of a substrate. The overlay metrology mark comprises a first axis, a second axis, a target feature and a plurality of alignment features. The second axis crosses the first axis. The target feature is disposed at an intersection of the first axis and the second axis. The plurality of alignment features are arranged along the first and second axes.

One aspect of the present disclosure provides a method of determining an overlay error during a semiconductor fabrication. The method comprises steps of forming a first structural layer comprising a target feature over a wafer; forming a second structural layer comprising a first axis, a second axis and a pair of alignment features over the first structural layer, wherein the pair of alignment features are disposed at the first and the second axes; and determining a relative displacement of the first and second structural layers using a position of the first axis relative to the target feature and a position of the second axis relative to the target feature.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of determining an overlay error during a semiconductor fabrication, comprising:
    forming a first structural layer deposited over a wafer, the first structural layer comprising first patterned structures and a target feature;
    forming a second structural layer deposited over the first structural layer, the second structural layer comprising second patterned structures correspondingly over the first patterned structures, a first axis, a second axis and a pair of alignment features, wherein the pair of alignment features are disposed at the first and the second axes, wherein an intersection of the first and second axes is deposited correspondingly over the target feature; and
    determining a relative displacement of the first and second structural layers using a position of the first axis relative to the target feature and a position of the second axis relative to the target feature.

2. The method of claim 1, further comprising:
    recording at least one image of a substrate comprising the wafer, the first structural layer and the second structural layer,
    wherein the relative displacement of the first and second structural layers is determined based on the at least one image.

3. The method of claim 1, wherein the first axis is formed to bisect one of the pair of alignment features; the second axis, crossing the first axis, is formed to bisect the another one of the pair of alignment features; and the first structural layer and the second structural layer are properly aligned when an intersection of the first axis and the second axis overlaps the target feature.

4. The method of claim 1, wherein the first axis is formed to bisect one of the pair of alignment features; the second axis, crossing the first axis, is formed to bisect the another one of the pair of alignment features; and the first structural layer and the second structural layer are not properly aligned when an intersection of the first axis and the second axis is offset from the target feature.

5. The method of claim 1, wherein the first structural layer and the second structural layer are not properly aligned when one of the first axis and the second axis is offset from the target feature.

6. Method of claim 1, wherein the second structural layer is formed using a lithography process.

7. The method of claim 1, wherein the second structural layer comprises photoresist material.

8. The method of claim 1, wherein the first axis, the second axis, the pair of alignment features and the target feature are located in at least one scribe line on the wafer.

9. The method of claim 1, wherein a shortest distance between the first axis and the second alignment feature is equal to a shortest distance between the second axis and the first alignment feature.

10. The method of claim 1, wherein the target feature comprises two line segments, and the first and second axes overlap the line segments respectively when the first layer and the second layer are properly aligned.

11. The method of claim 1, wherein the first axis is orthogonal to the second axis.

12. The method of claim 1, wherein the target feature has a cross shape.

13. The method of claim 1, wherein the first alignment feature and the second alignment feature are respectively composed of repetitious micro-structures.

14. The method of claim 1, wherein the first alignment feature and the second alignment feature respectively have a square profile and are composed of a plurality of square micro-structures, and the micro-structures are separated from each other via a pair of void zones.

15. The method of claim 14, wherein the void zones have a first width, and the micro-structures have a second width greater than the first width.

16. The method of claim 14, wherein the pair of the void zones comprises a horizontal void zone and a longitudinal void zone, the first axis extends through the horizontal void zone of the first alignment feature located at the first axis, and the second axis extends through the longitudinal void zone of the second alignment feature located at the second axis.

* * * * *